(12) United States Patent
Kawai

(10) Patent No.: US 10,952,343 B2
(45) Date of Patent: Mar. 16, 2021

(54) ASSEMBLED BODY

(71) Applicant: TOKAI KOGYO CO., LTD., Obu (JP)

(72) Inventor: Tetsuji Kawai, Obu (JP)

(73) Assignee: TOKAI KOGYO CO., LTD., Obu (JP)

( * ) Notice: Subject to any disclaimer, the term of this patent is extended or adjusted under 35 U.S.C. 154(b) by 0 days.

(21) Appl. No.: 16/648,655

(22) PCT Filed: Oct. 19, 2018

(86) PCT No.: PCT/JP2018/038965
§ 371 (c)(1),
(2) Date: Mar. 18, 2020

(87) PCT Pub. No.: WO2019/097952
PCT Pub. Date: May 23, 2019

(65) Prior Publication Data
US 2020/0288595 A1 Sep. 10, 2020

(30) Foreign Application Priority Data
Nov. 16, 2017 (JP) ............................ JP2017-220718

(51) Int. Cl.
*H05K 5/06* (2006.01)
*H05K 5/00* (2006.01)

(52) U.S. Cl.
CPC ........... *H05K 5/069* (2013.01); *H05K 5/0069* (2013.01); *H05K 5/061* (2013.01)

(58) Field of Classification Search
CPC .. H05K 5/0026; H05K 5/0069; H05K 5/0247; H05K 5/06; H05K 5/061; H05K 5/069; H01R 13/52; H01R 13/521
See application file for complete search history.

(56) References Cited

U.S. PATENT DOCUMENTS 5,284,448 A * 2/1994 Hussmann ........... H05K 5/0069
439/544
6,368,130 B1 * 4/2002 Fukuda ................. H01R 13/52
439/271
(Continued)

FOREIGN PATENT DOCUMENTS

CN 104143730 A 11/2014
CN 104203530 A 12/2014
(Continued)

OTHER PUBLICATIONS

Dec. 25, 2018 International Search Report issued in International Patent Application No. PCT/JP2018/038965.
(Continued)

*Primary Examiner* — Timothy J Thompson
*Assistant Examiner* — Amol H Patel
(74) *Attorney, Agent, or Firm* — Oliff PLC

(57) ABSTRACT

An assembled body attachable to an attached body includes: a main body member made of a rigid material; an annular seal member made of a material that is more easily deformed than the main body member, and assembled on the main body member to close a gap between the main body member and the attached body; and a cover member assembled on the main body member. The main body member is formed with an attachment portion to be disposed inside the attached body, and the cover member is installed on the attachment portion. A seal member attachment region is assigned between a part of the main body member and the cover member, and the seal member attachment region is defined at least by an exposed surface of the attachment portion that is not covered by the cover member and one end surface of the cover member.

8 Claims, 9 Drawing Sheets

(56) References Cited

U.S. PATENT DOCUMENTS

| | | | |
|---|---|---|---|
| 2014/0030902 A1* | 1/2014 | Baudelocque | H01R 13/533 |
| | | | 439/271 |
| 2014/0242838 A1 | 8/2014 | Ikezawa | |
| 2014/0332263 A1* | 11/2014 | Sone | H05K 5/0069 |
| | | | 174/551 |
| 2014/0335713 A1 | 11/2014 | Wang et al. | |
| 2015/0044960 A1 | 2/2015 | Hara | |
| 2016/0036156 A1 | 2/2016 | Iihoshi | |
| 2016/0141796 A1* | 5/2016 | Nakai | H01R 13/5812 |
| | | | 439/459 |
| 2019/0052011 A1* | 2/2019 | Kondo | H01R 13/512 |
| 2020/0335901 A1* | 10/2020 | Yamada | H01R 13/5208 |
| 2020/0343668 A1* | 10/2020 | Yamada | H01R 13/516 |

FOREIGN PATENT DOCUMENTS

| | | |
|---|---|---|
| CN | 104885308 A | 9/2015 |
| JP | H06-060069 U | 8/1994 |
| JP | H11-111382 A | 4/1999 |
| JP | 2000-286017 A | 10/2000 |
| JP | 2014-164875 A | 9/2014 |

OTHER PUBLICATIONS

Dec. 25, 2018 Written Opinion of the International Searching Authority issued in International Patent Application No. PCT/JP2018/038965.

Nov. 18, 2020 Office Action issued in Chinese Patent Application No. 201880061809.1.

\* cited by examiner

[FIG. 1]
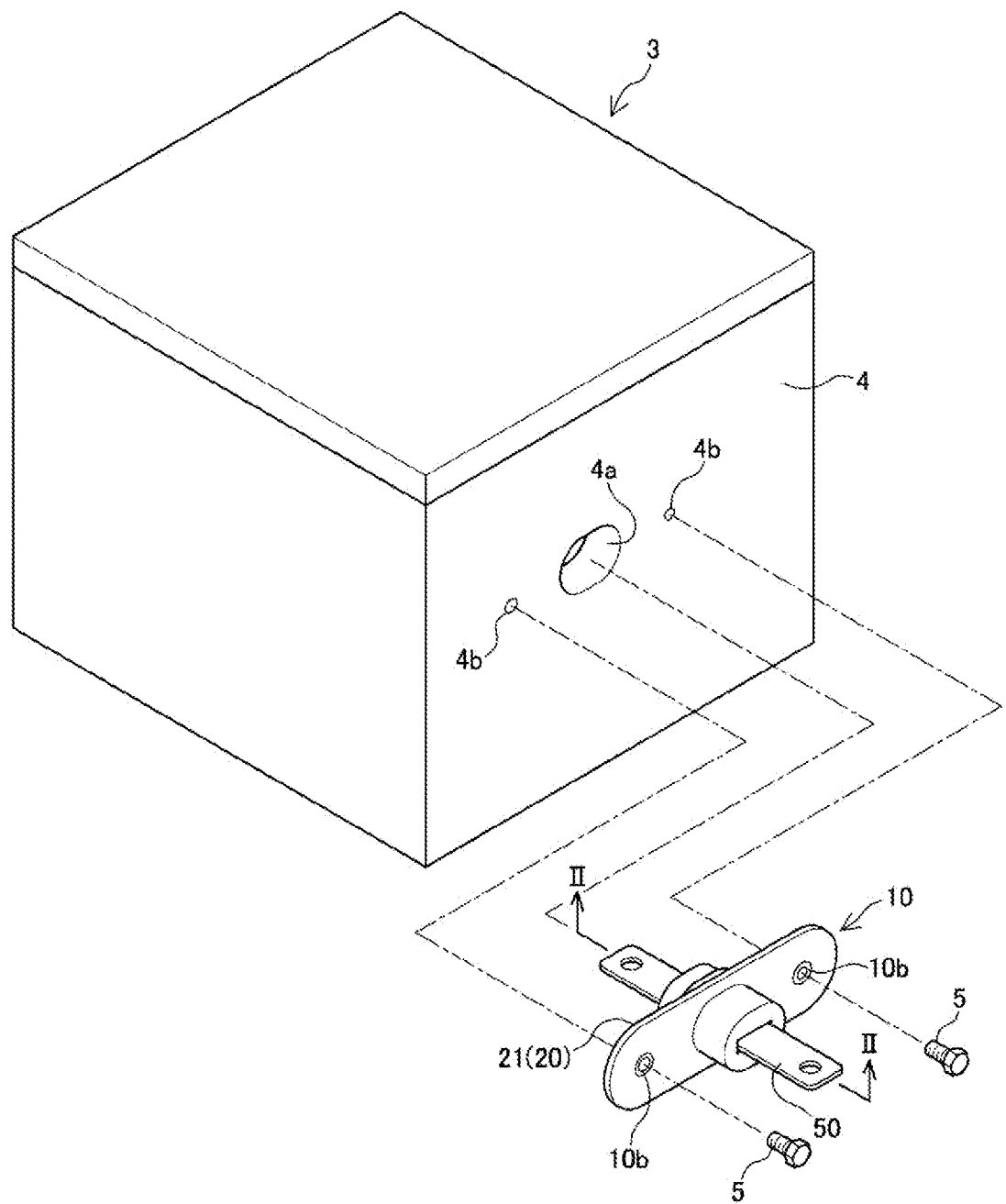

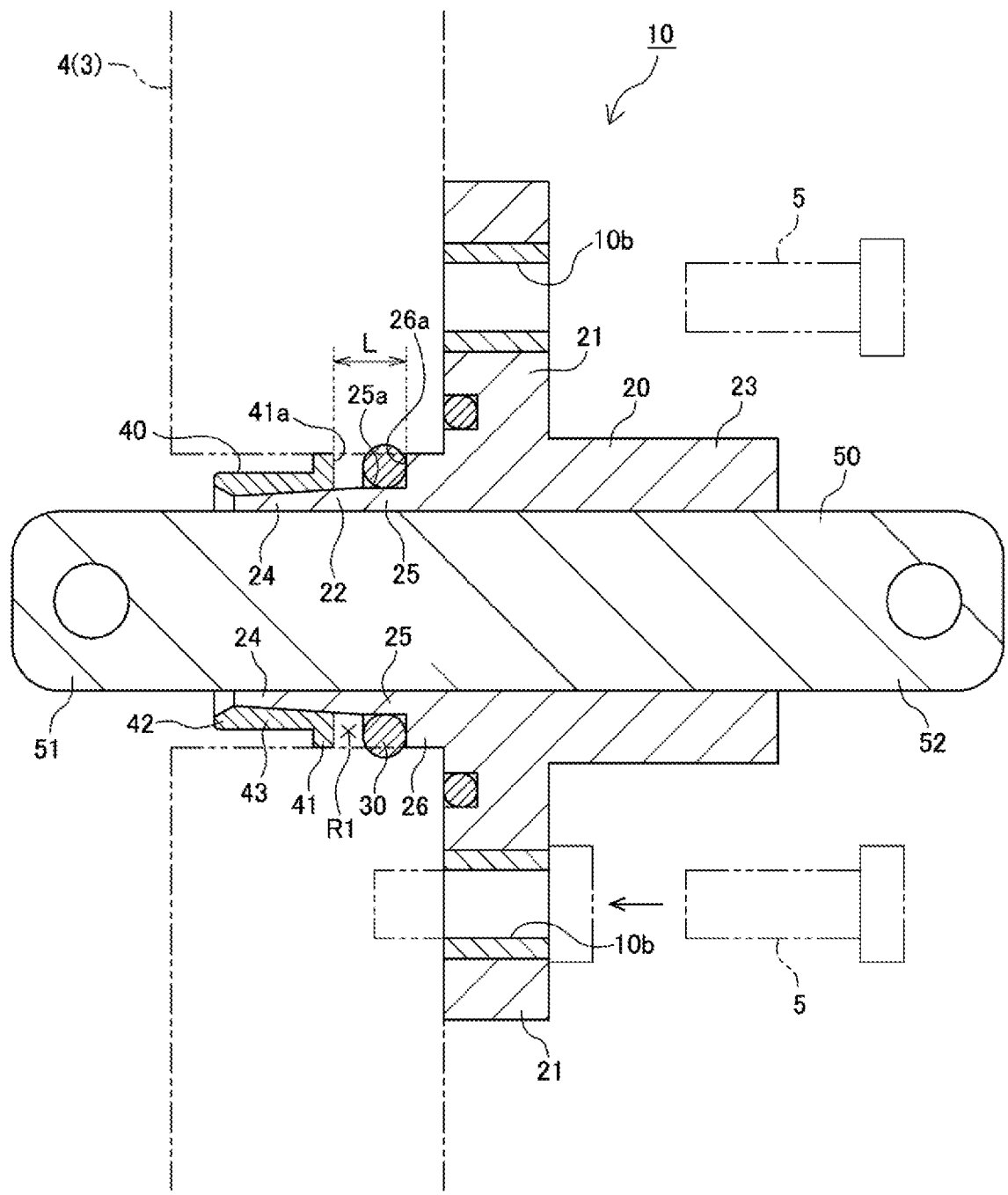
[FIG. 2]

[FIG. 3]
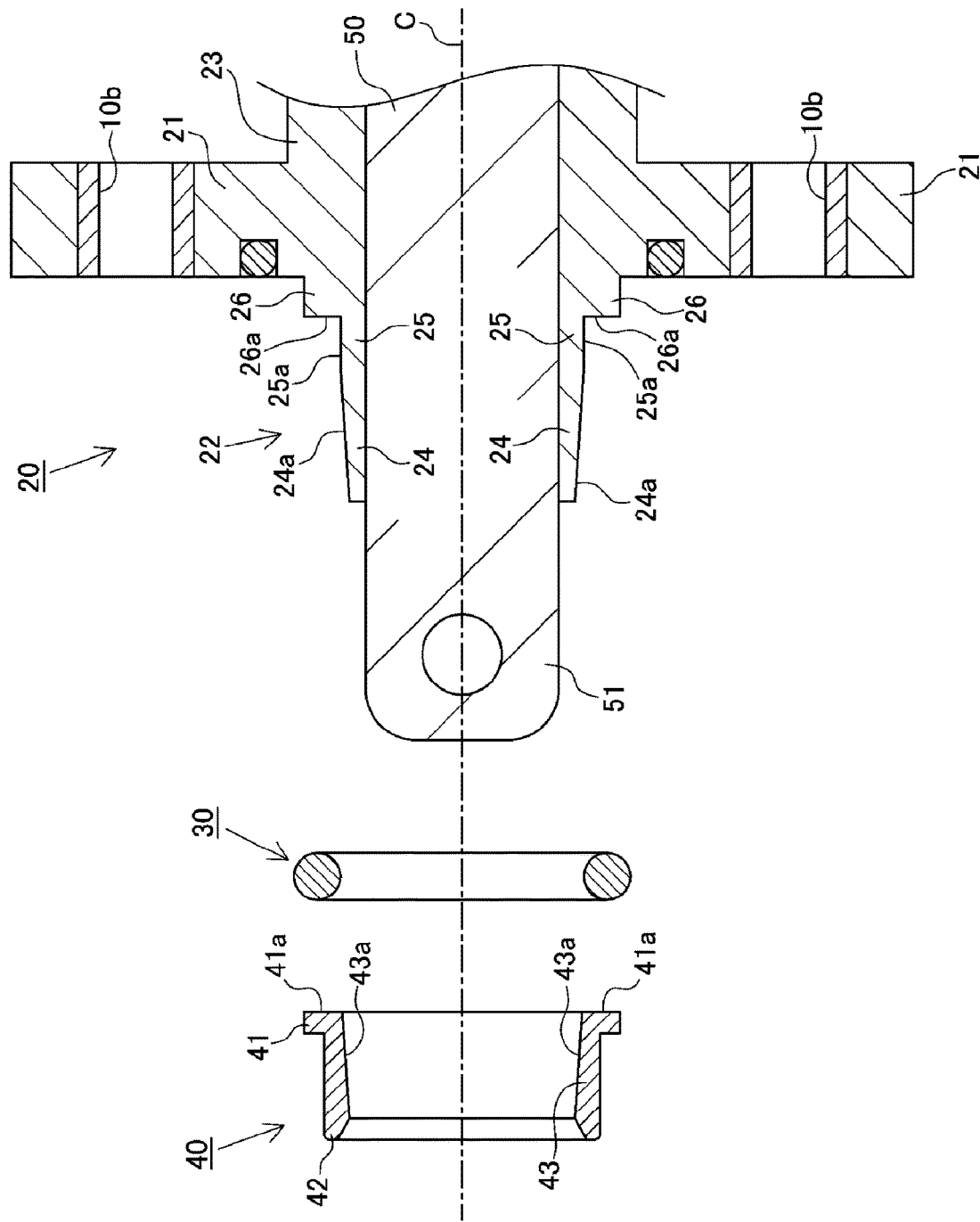

[FIG. 4]
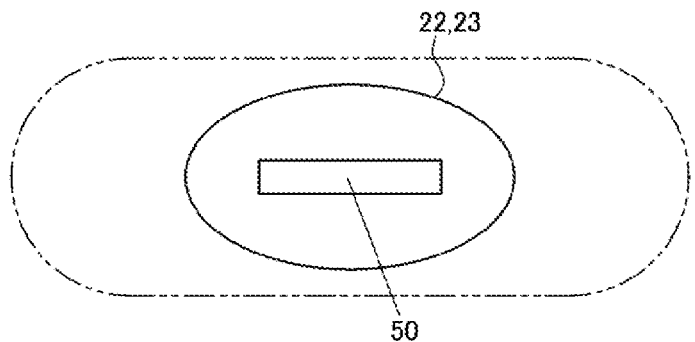
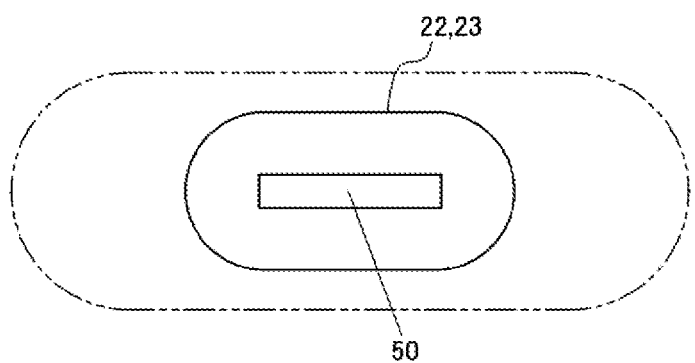
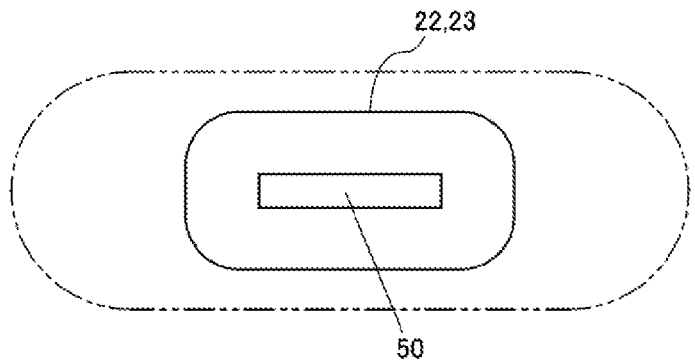
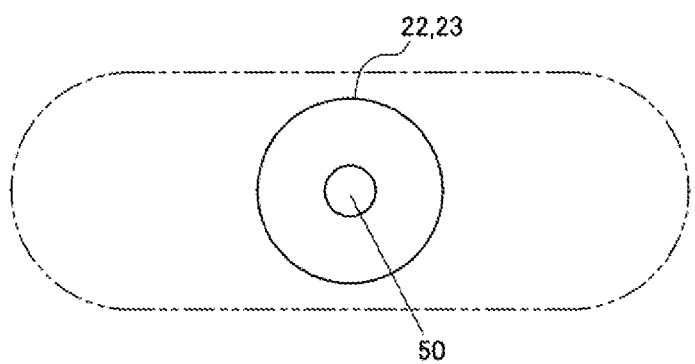

[FIG. 5]
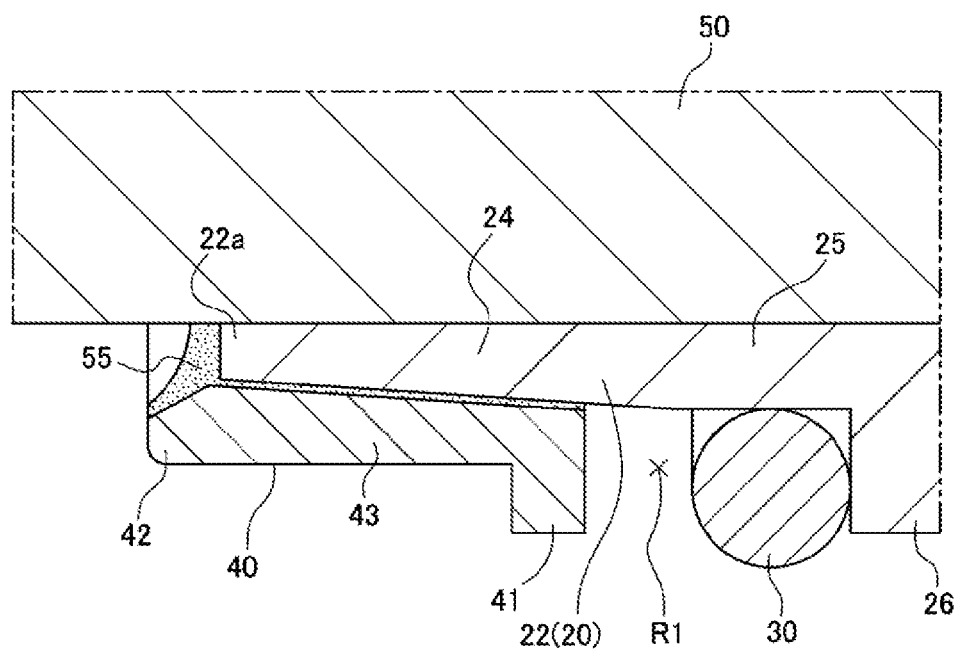

[FIG. 6]
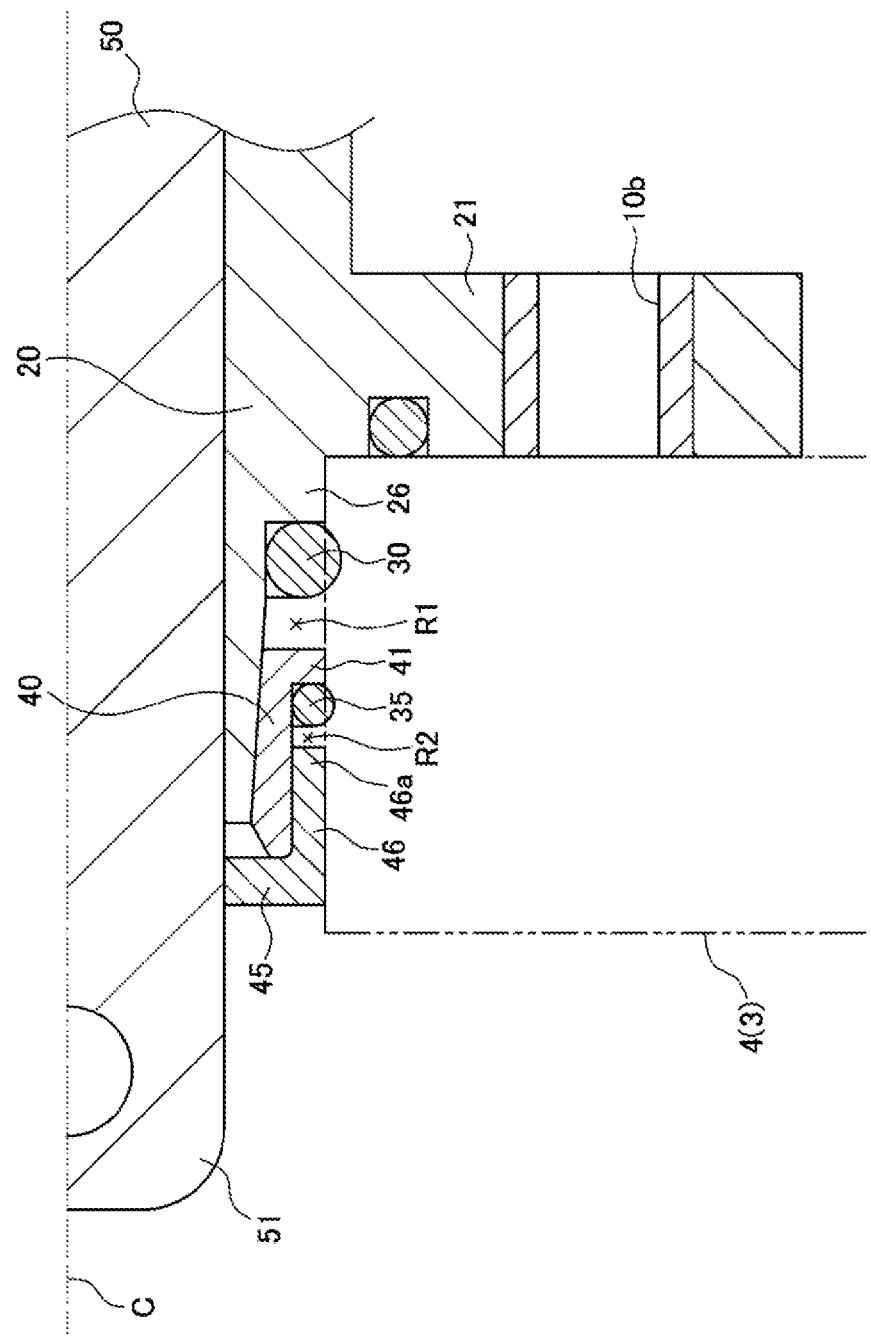

[FIG. 7]
(A)
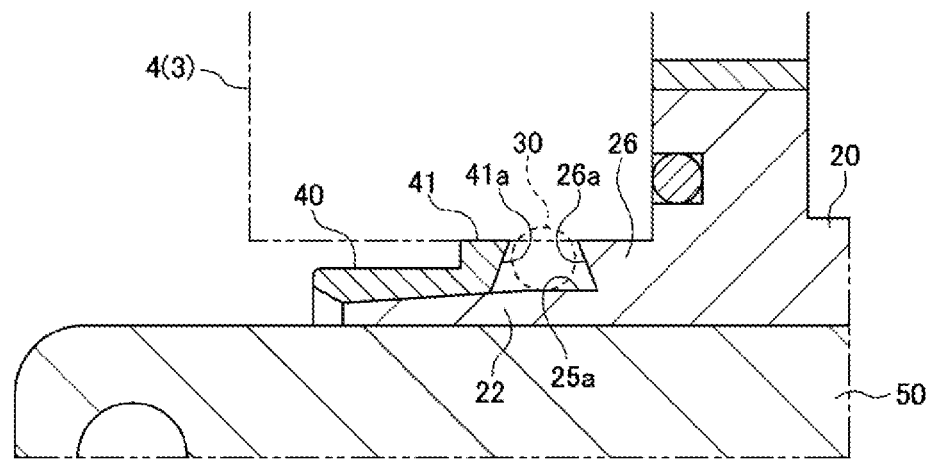
(B)
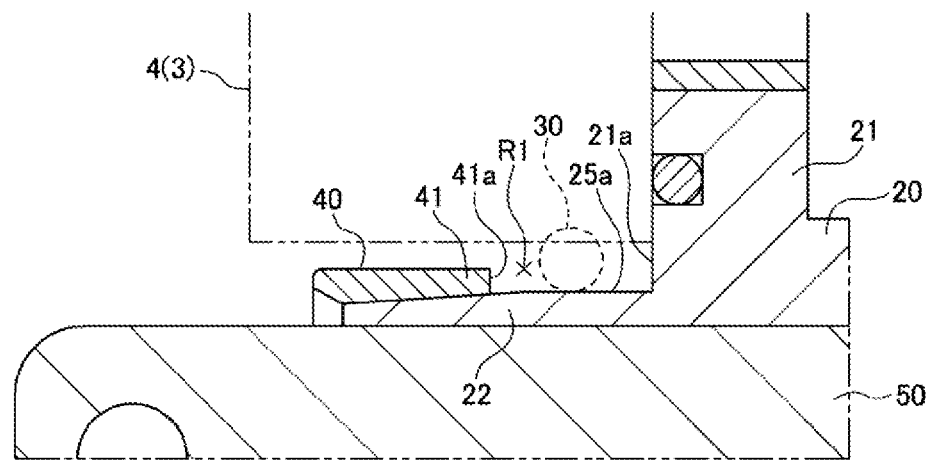

[FIG. 8]
(A)
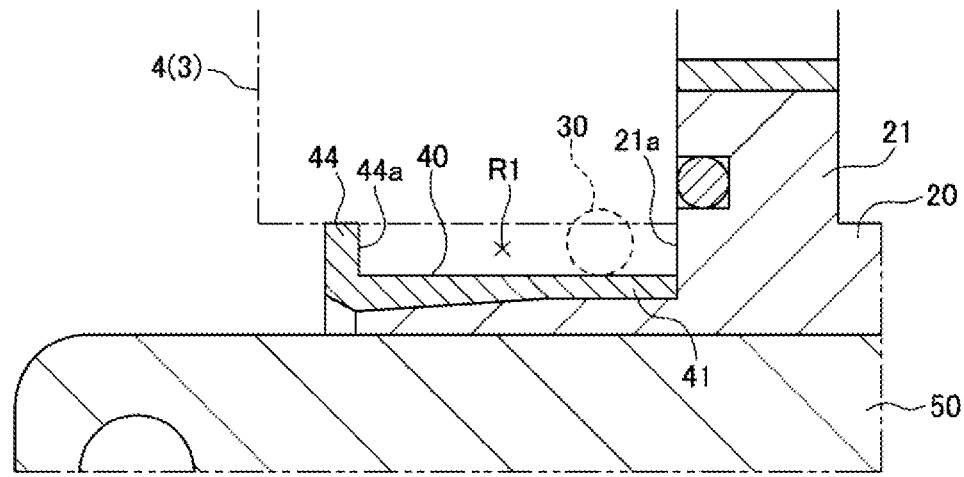
(B)
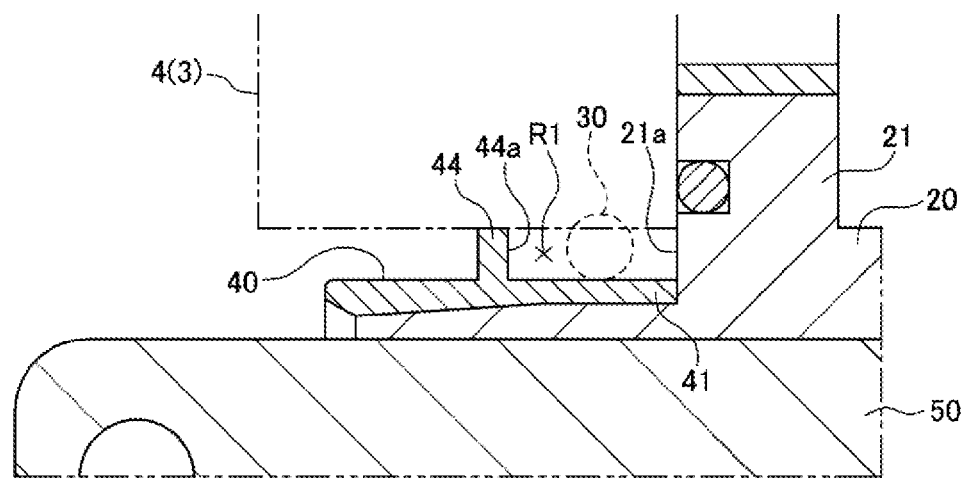

[FIG. 9]
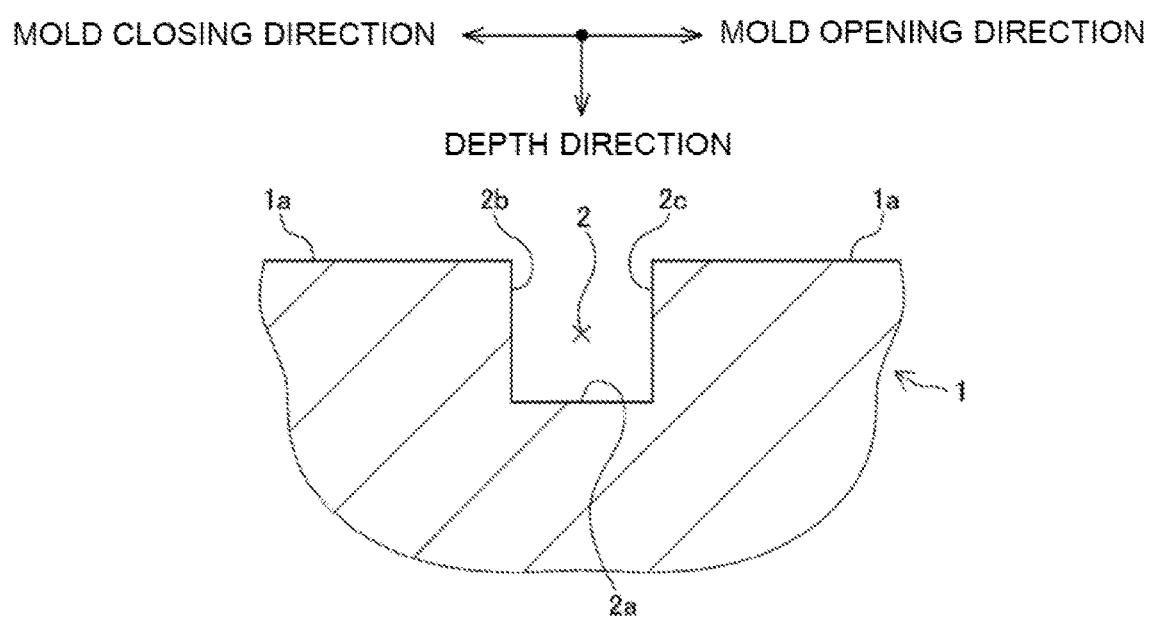

ASSEMBLED BODY

TECHNICAL FIELD

The present invention relates to an assembled body formed by assembling a plurality of members, and more particularly to an assembled body attached to an attached body and capable of ensuring a sealing property for waterproofing, for example, between the attached body and the assembled body.

BACKGROUND ART

Examples of an assembled body capable of ensuring a sealing property between the attached body as described above and the assembled body include a connection terminal component (generally called a "terminal block") for interconnecting electric and electronic devices. For example, the terminal block is attached to an attachment hole or a cylindrical attachment part which is provided in a case body of an electronic control unit (ECU) for a vehicle such that the terminal block is inserted.

PTL 1 (JP-A-2014-164875) discloses a terminal block (20) attached to a casing (10) of an electronic device (see FIGS. 1 and 2 of PTL 1). The terminal block includes a main body portion formed of an insulating resin portion (21) inside which a flat conductive terminal member (23) is located. An annular groove (215) is provided on an insertion portion (21A) of the resin portion (21), and an O-ring (216) as a seal member is attached to the groove (see paragraph 0027 and FIGS. 2 and 6 of PTL 1). In particular, as shown in FIG. 6 of PTL 1, a cross-sectional shape of the annular groove (215) has an under shape to prevent the O-ring (216) from being unnecessarily displaced (that is, deviated) along an axial direction of the terminal block.

Here, the "under shape" (also referred to as "undercut") refers to a complicated shape in which a molded product cannot be released simply by opening a mold in a single mold opening direction when the molded product is removed from the mold in resin molding (that is, at the time of releasing or opening the mold). For example, as shown in FIG. 9 of the present application, a concave portion or a groove 2 opened on a surface 1a of a substrate 1 is provided, and a depth direction of the concave portion or the groove 2 is substantially orthogonal to the mold opening direction (and a mold closing direction) of the mold. In such a case, the concave portion or the groove 2 becomes an under-shaped part in the resin molded product. That is, a concave shape having a U-shaped cross section that is opened in one direction (upward in FIG. 9) of a place that is defined by a bottom wall 2a of the concave portion or the groove 2 and two side walls 2b, 2c standing on both sides of the bottom wall 2a is an example of an under shape.

CITATION LIST

Patent Literature

PTL 1: JP-A-2014-164875

SUMMARY OF INVENTION

Technical Problem

However, the following inconveniences or difficulties are recognized in a holding structure of the seal member as in the terminal block of PTL 1.

(A): In order to form the annular groove (215) on the resin portion (21) which is a single member, it is necessary to make the cross-sectional shape of the groove into the under shape as described above. Therefore, the mold structure for molding the resin portion and the main body portion of the terminal block becomes complicated, and difficulty and cost of resin molding are increased. (B): If the under-shaped groove is directly molded by injection molding, excessive protrusions (also referred to as "burrs") caused by a partition surface are inevitably formed on a bottom wall and side walls of the groove (that is, a part where the seal member is set). Therefore, there is a possibility that sufficient waterproofness cannot be ensured when the seal member is attached. Further, if secondary processing such as polishing is performed to remove the above-described excessive projections (burrs), the production cost will increase.

An object of the present invention is to provide an assembled body of which constitutive members are easily molded and are easily assembled, and which is excellent in a sealing property such as waterproofing.

Solution to Problem

According to a first aspect of the invention, there is provided an assembled body attachable to an attached body, the assembled body including:

a main body member made of a rigid material and forming a main part of the assembled body;

an annular seal member made of a material that is more easily deformed than the main body member, and assembled on the main body member to close a gap between the main body member and the attached body; and a cover member assembled on the main body member, in which the main body member is formed with an attachment portion to be disposed inside the attached body, and the cover member is installed on the attachment portion so as to cover a part of an outer periphery of the attachment portion, and a seal member attachment region extending annularly along the outer periphery of the attachment portion is assigned between a part of the main body member and the cover member installed on the attachment portion of the main body member, and the seal member attachment region is defined at least by an exposed surface of the attachment portion that is not covered by the cover member and one end surface of the cover member.

According to the present invention, the annular seal member attachment region is assigned on the main body member by installing the cover member on the attachment portion of the main body member. That is, when the assembly of the assembled body according to the present invention is completed, the seal member attachment region defined by the exposed surface of the attachment portion and the one end surface of the cover member has a substantially under-shaped cross-section, and holds the seal member while appropriately restraining axial displacement of the seal member. Therefore, according to the present invention, it is not necessary to impart the under shape to each of the constituent members (for example, the main body member) in advance, and the constituent members can be easily molded and be easily assembled.

Further, since there is no under shape in the main body member itself (single unit), it is not necessary to provide a parting line (PL) for forming an outer shape even when the main body member itself is molded by injection molding. Therefore, the excess protrusions as described in the above (B) are not formed on a surface of the attachment portion (at least on the exposed surface). Therefore, the surface of the attachment portion (exposed surface) is smooth, and the seal member can be brought into contact with the exposed surface of the attachment portion without any gap, and a good sealing property between the attached body and the assembled body can be maintained.

According to a second aspect of the invention, in the assembled body according to the first aspect, the annular seal member attachment region has a substantially U-shaped cross section.

According to the second aspect of the invention, in addition to the effect of the first aspect of the invention, the following effect is further obtained. That is, since the seal member attachment region has the substantially U-shaped cross-section, it is possible to prevent the positional deviation of the seal member and the detachment (separation) from the attachment region.

According to a third aspect of the invention, in the assembled body according to the first or the second aspect, the main body member has a step portion having a surface that faces one end portion of the cover member installed on the attachment portion, and the seal member attachment region is provided between the one end portion of the cover member and the step portion of the main body member.

According to the third aspect of the invention, in addition to the effect of the first or the second aspect of the invention, the following effect is further obtained. That is, the one end portion of the cover member and the step portion of the main body member involved in the construction of the seal member attachment region contribute to preventing the positional deviation of the seal member and the detachment (separation) from the attachment region.

According to a fourth aspect of the invention, in the assembled body according to any one of the first to the third aspects, at least a part, on which the cover member is installed, of the attachment portion of the main body member has a tapered shape.

According to the fourth aspect of the invention, in addition to the effect of the first to the third aspects of the invention, the following effect is further obtained. That is, since the attachment portion of the main body member has the tapered shape, installation or assembly of the cover member on the attachment portion becomes easy. In addition, there is an advantage that an outer shape of the assembled body (radial dimension) does not become too large after the cover member is attached.

In the assembled body according to any one of the first to the fourth aspects, a fifth aspect of the invention further includes a second seal member.

According to the fifth aspect of the invention, in addition to the effect of the first to the fourth aspects of the invention, the following effect is further obtained. That is, by providing two or more seal members, the sealing property such as waterproofness can be further enhanced.

In the assembled body according to the fifth aspect, a sixth aspect of the invention further includes:
a second cover member provided correspondingly to the second seal member, in which
a second seal member attachment region for the second seal member is provided between the cover member and the second cover member.

According to the sixth aspect of the invention, in addition to the effect of the fifth aspect of the invention, the following effect is further obtained. That is, since the second seal member attachment region can be added between the two cover members, a plurality of seal member attachment regions can be easily realized.

According to a seventh aspect of the invention, in the assembled body according to any one of the first to the sixth aspects, the cover member is fixed to the attachment portion of the main body member by an adhesive.

According to the seventh aspect of the invention, in addition to the effect of the first to the sixth aspects of the invention, the following effect is further obtained. That is, the use of the adhesive makes it possible to relatively easily fix the attachment portion of the main body member and the cover member without relying on a mechanical fitting relationship (for example, an uneven fitting relationship).

In the assembled body which functions as a terminal block according to any one of the first to the seventh aspect, an eighth aspect of the invention further includes:
a bus bar functioning as a conductive terminal member, in which
the main body member includes a plate-shaped base portion and a protruding portion protruding from the base portion,
a part of the bus bar is embedded in the main body member, and another part of the bus bar protrudes outward from the protruding portion of the main body member and is exposed, and
the cover member is provided around the protruding portion of the main body member.

According to the eighth aspect of the invention, it is possible to provide the terminal block having the same effects as those of the first to seventh aspects.

Advantageous Effects of Invention

As described in detail above, according to the present invention, it is to provide the assembled body of which the constitutive members are easily molded and are easily assembled, and which is excellent in the sealing property such as waterproofing.

BRIEF DESCRIPTION OF DRAWINGS

FIG. 1 is a schematic perspective view showing an example of a mode of attaching an assembled body (terminal block) to an attached body (case body).

FIG. 2 is a horizontal cross-sectional view (cross-sectional view taken along a line II-II in FIG. 1) of the assembled body (terminal block) according to an embodiment of the present invention.

FIG. 3 is a horizontal cross-sectional view of the assembled body shown in FIG. 2 in an exploded state.

Parts (A) to (D) of FIG. 4 are views schematically showing various shapes of a protruding portion in a main body member of the assembled body.

FIG. 5 is an enlarged cross-sectional view of a part of the assembled body shown in FIG. 2.

FIG. 6 is a partial horizontal cross-sectional view of an assembled body (terminal block) according to another embodiment of the present invention.

Parts (A) and (B) of FIG. 7 are partial cross-sectional views showing modifications of the present invention.

Parts (A) and (B) of FIG. 8 are partial cross-sectional views showing further modifications of the present invention.

FIG. 9 is a cross-sectional view for exemplifying the meaning of "under shape" in the present application.

DESCRIPTION OF EMBODIMENTS

Hereinafter, an embodiment in which an assembled body according to the present invention is embodied in a terminal block will be described with reference to FIGS. 1 to 5.

FIG. 1 schematically shows a terminal block 10 as the assembled body and a case body 3 as an attached body to which the terminal block 10 is attached. The case body 3 is, for example, an electronic control unit (ECU) for an automobile, and an electronic device such as an electronic circuit board is housed in the ECU. A large-diameter attachment hole 4a and a pair of nut holes 4b are provided on one side wall 4 of the case body 3, and particularly, the large-diameter attachment hole 4a is formed to penetrate the side wall 4. The large-diameter attachment hole 4a serves as "an attached portion in the attached body" that holds the terminal block 10 for electrically connecting or connecting the inside and outside of the case body 3 on the side wall 4. A pair of nut holes 10b corresponding to the pair of nut holes 4b are provided on the terminal block 10. The terminal block 10 is inserted into the attachment hole 4a of the case body 3, the nut hole 10b on a terminal block side is aligned with the nut hole 4b on a case body side, and a nut 5 is screwed thereto, whereby the terminal block 10 is fixed to the side wall 4 of the case body 3.

As shown in FIGS. 2 and 3, the terminal block 10 is an assembled body formed by assembling a main body member 20, an annular seal member 30, and a cover member 40. The main body member 20 is manufactured by injection molding an electrically insulating resin material having a certain rigidity. Examples of the usable electrically insulating resin material include a polyphenylene sulfide (PPS) resin and a polybutylene terephthalate (PBT) resin, and these resins may be mixed with additive materials such as glass fibers and glass flakes, other resin materials, and elastomer materials. A bus bar 50 as a conductive terminal member is made of a conductive material such as copper, aluminum, iron, and may be subjected to a surface treatment such as plating. Examples of the type of plating include Sn plating, Ni plating, Au plating, Ag plating, and Sn—Ag alloy plating. Further, since the bus bar 50 is incorporated as an insert during injection molding of the main body member 20, the bus bar 50 is embedded in or integrated with the main body member 10 in advance.

<Main Body Member 20>

As shown in FIGS. 2 and 3, the main body member 20 includes a plate-shaped base portion 21 extending in a radial direction of a central axis C, and a first protruding portion 22 and a second protruding portion 23 which protrude in a front-rear direction along the central axis C from a central region of the base portion 21. The plate-shaped base portion 21 serves as a flange (shown as a substantially elongated round shaped flange in FIG. 1) for attaching the case body 3, and the nut holes 10b are formed through both sides (an upper side and a lower side in FIGS. 2 and 3) of the base portion 21.

The shapes of the substantially columnar first and second protruding portions 22, 23 are not particularly limited, but are preferably an elliptical shape (see part (A) of FIG. 4), an elongated round shape (see part (B) of FIG. 4), or a quadrangular shape in which four corners are rounded (see part (C) of FIG. 4) when viewed from the front (or the back). These preferable front surface shapes (or back surface shapes) correspond to a fact that the bus bar 50 is a thin metal piece having a long length and a short width. If the bus bar 50 is a rod-shaped member having a circular cross section, the front surface shapes (or the back surface shape) of the first and second protruding portions 22, 23 corresponding thereto may be circular (see FIG. 4(D)). Incidentally, in FIGS. 1 to 3 of the present application, the main body member 20 is depicted as having both of the protruding portions 22, 23 having the elliptical shape or the elongated round shape.

The bus bar 50 is provided so as to penetrate the first protruding portion 22, the base portion 21, and the second protruding portion 23 of the main body member 20 along the central axis C. Since a central part of the bus bar 50 in a longitudinal direction is embedded in the main body member 20, the first end portion 51 of the bus bar protrudes further outward from a tip end of the first protruding portion 22 and is exposed to the outside air, and the second end portion 52 of the bus bar protrudes further outward from a tip end of the second protruding portion 23 and is exposed to the outside air (see FIG. 2).

Since the structure of the first protruding portion 22 and a peripheral portion of the first protruding portion 22 is essential in the present invention, the first protruding portion 22 (hereinafter, simply referred to as "protruding portion 22") will be described in detail below. At least the protruding portion 22 of the main body member 20 functions as "an attachment portion to be disposed inside the attached body".

As shown in FIGS. 2 and 3, the protruding portion 22 includes a base end portion connected to the central region of the base portion 21, and a tip end portion positioned on a side opposite to the base end portion in an axial direction. The protruding portion 22 can be divided into a part near a tip end 24 and a part near a base end 25 along the axial direction. An outer peripheral part of the part near the tip end 24 of the protruding portion 22 is formed in a gently inclined tapered shape (that is, a shape that is gradually tapered toward the tip end). Therefore, an outer peripheral surface 24a is a kind of conical surface. The tapered part near the tip end 24 serves as a cover member support section that comes into contact with the cover member 40 to support the cover member 40 from the inside. The part near the base end 25 of the protruding portion 22 is formed in a non-tapered columnar shape. Therefore, an outer peripheral surface 25a is a kind of cylindrical surface. The part near the base end 25 serves as a seal member support section that comes into contact with the annular seal member 30 to support the seal member 30 from the inside.

The base end portion of the protruding portion 22 (or the part near the base end 25) is connected to the central region of the base portion 21 of the main body member. An outer peripheral side of the protruding portion 22 is provided with an annular step portion 26 so as to surround the base end portion of the protruding portion 22 (or the part near the base end 25). The step portion 26 is provided with an annular front end surface 26a extending in the radial direction of the main body member 20. The meaning of the front end surface 26a will be described later.

<Seal Member 30>

The seal member 30 is an annular member assembled on the main body member 20, and is made of a material that is more flexible and more easily deformed than the resin material constituting the main body member 20. Examples of the constituent material of the seal member 30 include silicone rubber, EPDM, nitrile rubber, or fluororubber.

<Cover Member 40>

As shown in FIGS. 2 and 3, the cover member 40 is a substantially cylindrical member made of the same material as the constituent material of the main body member 20. The cover member 40 may be made of a material different from the constituent material of the main body member 20. The cover member 40 has one end portion (referred to as a base end portion 41) and the other end portion (referred to as a tip end portion 42) in the axial direction thereof. Preferably, as shown in the drawing, the base end portion 41 is formed in an annular ridge shape slightly protruding in the radial direction, but the base end portion 41 may remain in a shape that does not protrude in the radial direction. A peripheral wall portion of the cover member 40 positioned between the base end portion 41 and the tip end portion 42 has a constant thickness. An inside portion (referred to as an inner peripheral portion 43) of the substantially cylindrical peripheral wall portion has a reverse-tapered shape that is complementary to the tapered shape of the part near the tip end 24 of the protruding portion 22 of the main body member 20. That is, the inner peripheral portion 43 of the cover member 40 is formed in a gently inclined bowl shape in which an inner diameter gradually decreases from a base end side toward a tip end side of the cover member, and an inner peripheral surface 43a is in the form of a kind of conical surface.

As described above, the inner peripheral surface 43a of the inner peripheral portion 43 of the cover member 40 and the outer peripheral surface 24a of the part near the tip end 24 of the protruding portion 22 of the main body member are complementary to each other. Therefore, when the cover member 40 is attached (or externally fitted) to the part near the tip end 24 of the protruding portion 22 of the main body member, the inner peripheral surface 43a of the inner peripheral portion of the cover member and the outer peripheral surface 24a of the part near the tip end of the protruding portion of the main body member are in close contact with each other. Also, the cover member 40 is accurately positioned on the part near the tip end 24 of the protruding portion 22 of the main body member based on a fitting relationship of the tapered shapes of both the part near the tip end 24 and the inner peripheral portion 43. At the completion of the positioning, the cover member 40 cannot be moved closer to the base portion 21 of the main body member 20, and the base end portion 41 of the cover member 40 is uniquely positioned at a position separated by a predetermined interval L from the step portion 26 of the main body member 20 (see FIG. 2). A rear end surface 41a of the base end portion 41 of the cover member 40 is an annular end surface extending in the radial direction of the main body member 20, and therefore, the rear end surface 41a is in parallel with and faces the front end surface 26a of the step portion 26 with the predetermined interval L therebetween.

As shown in FIG. 2, when positioning of the cover member 40 with respect to the protruding portion 22 is completed by externally fitting the cover member 40 to the protruding portion 22 of the main body member 20, a seal member attachment region R1 extending annularly along a circumferential direction of the protruding portion 22 is assigned between the step portion 26 of the main body member 20 and the base end portion 41 of the cover member 40 positioned on the protruding portion 22 of the main body member. The seal member attachment region R1 is defined into an annular groove shape by the outer peripheral surface of the outer peripheral surface of the protruding portion 22 that is not covered by the cover member 40 (mainly the outer peripheral surface 25a of the part near the base end 25), and the front end surface 26a of the step portion 26 and the rear end surface 41a of the base end portion 41 of the cover member which stand on both front and rear sides of the outer peripheral surface of the protruding portion 22. In other words, the seal member attachment region R1 has a substantially U-shaped cross section surrounded by the three surfaces (25a, 26a, 41a). In a state in which the seal member 30 is disposed or accommodated in the seal member attachment region R1, the front end surface 26a of the step portion 26 and the rear end surface 41a of the base end portion 41 of the cover member function as a pair of restraining surfaces (26a, 41a) that restrain axial displacement of the seal member 30 within the interval L described above. Although the restraining surfaces (26a, 41a) are shown in a state parallel to each other in FIG. 2, that is, in a state perpendicular to the outer peripheral surface (25a) of the protruding portion 22, either or both of the restraining surfaces (26a, 41a) may be non-perpendicularly inclined to the outer peripheral surface (25a) of the protruding portion 22 (an example is shown in part (A) of FIG. 7).

<Assembly or the Like>

The terminal block 10 of the present embodiment is assembled in the following procedure. That is, the annular seal member 30 is externally fitted to the protruding portion 22 of the main body member 20 with the bus bar 50 from a tip end side of the protruding portion 22, and the seal member 30 is attached to a position adjacent to the step portion 26 on the part near the base end 25 of the protruding portion. Then, a substantially cylindrical cover member 40 is externally fitted to the protruding portion 22 of the main body member 20, and the cover member 40 is attached to the part near the tip end 24 of the protruding portion adjacent to the part near the base end 25.

More preferably, after that, as shown in the partially enlarged cross-sectional view of FIG. 5, the cover member 40 may be fixed to the main body member 20 by applying or overlaying an adhesive 55 as a potting agent on at least a part of a substantially annular region formed between the tip end portion 22a of the protruding portion 22 and an inner periphery of the tip end portion 42 of the cover member 40. At this time, a part of the adhesive 55 applied to or overlaid on the substantially annular region enters a slight clearance (gap) between the outer peripheral surface 24a of the part near the tip end 24 of the protruding portion and the inner peripheral surface 43a of the inner peripheral portion 43 of the cover member. A small clearance is filled with the adhesive 55 that has entered, and the cover member 40 is firmly fixed to the main body member 20. Examples of usable adhesive (potting agent) include a silicone resin, an epoxy resin, and an acrylic resin.

According to the terminal block 10 of the present embodiment, the annular seal member attachment region R1 can be assigned on the main body member 20 by installing the cover member 40 on the protruding portion 22 of the main body member 20. When the assembly of the terminal block 10 is completed, the seal member attachment region R1 defined by the outer peripheral surface 25a of the protruding portion 22, the front end surface 26a of the step portion 26 (the outer peripheral surface 25a and the front end surface 26a correspond to "exposed surface of the attachment portion that is not covered by the cover member"), and the rear end surface 41a of the base end portion 41 of the cover member has a substantially under-shaped cross-section, and stably holds the seal member 30 while appropriately restraining the axial displacement of the seal member 30. Therefore, according to the present embodiment, it is not necessary to impart the under shape to each of the constituent members (20, 30, 40) of the terminal block 10 in advance, and the constituent members can be molded and assembled with ease.

Further, since there is no under shape in the main body member 20 itself, it is not necessary to provide a parting line (PL) even when the main body member 20 itself is formed by injection molding, and therefore, the excess protrusions as described in the above (B) are not formed on a surface of the protruding portion 22 (at least on the exposed surface). Therefore, the surface (exposed surface) of the protruding portion 22 is smooth, and the seal member 30 can be brought into contact with the protruding portion 20 without a gap.

[Modifications or the Like]

Although one cover member 40 is provided to correspond to one sealing member 30 in the above-described embodiment of FIGS. 1 to 5, the terminal block (10) using a plurality of sets of seal members and cover members may be used. For example, a second embodiment shown in FIG. 6 is a modification in which a second seal member 35 and a second cover member 45 are added to the above-described (first) embodiment shown in FIGS. 1 to 5. In FIG. 6, the main body member 20, the first seal member 30, and the first cover member 40 are basically the same as those in the above-described (first) embodiment, and the first seal member attachment region R1 is assigned between the step portion 26 of the main body member 20 and the base end portion 41 of the first cover member 40.

Further, in FIG. 6, the second cover member 45 is disposed in front of a first cover member 40 (tip end portion side), and an outer peripheral portion 46 of the second cover member 45 covers the part near the tip end of the first cover member 40. As a result, a second seal member attachment region R2 similar to the first seal member attachment region R1 is assigned between the base end portion 41 of the first cover member 40 and one end portion 46a of the outer peripheral portion 46 of the second cover member 45. In other words, the second seal member attachment region R2 is defined into an annular groove shape by an exposed surface of the outer peripheral surface of the first cover member 40 that is not covered by the second cover member 45, and the base end portion 41 of the first cover member 40 and the one end portion 46a of the outer peripheral portion 46 of the second cover member 45 which stand upright on both front and rear sides of the exposed surface. The second seal member 35 is disposed in the second seal member attachment region R2. According to the modification of FIG. 6, the two seal members (30, 35) can be installed on the terminal block by providing a plurality of seal member attachment regions, and the sealing property can be further enhanced.

The present invention is applicable not only to the terminal block, and the present invention may be applied to a connector part of an electronic device housing case or a connection part of a tubular body such as a pipe.

Although FIG. 1 shows a case where the terminal block 10 is attached from the outside of the case body 3, the terminal block 10 can be attached from the inside of the case body 3.

In the above embodiment, the cover members (40, 45) correspond to the seal members (30, 35) one-to-one, but two or more seal members may be designed to correspond to one cover member.

The number of the cover members is not limited to one or two, and may be three or more.

In the embodiment shown in FIGS. 2 and 3, the annular step portion 26 in the main body member 20 is not necessary, and the protrusion of the base end portion 41 of the cover member 40 in the radial direction as described above is not necessary. Therefore, the structure may be simplified as, for example, shown in part (B) of FIG. 7. According to part (B) of FIG. 7, an annular groove-shaped seal member attachment region R1 is defined by the outer peripheral surface 25a of the protruding portion 22, a front end surface 21a of the base portion 21 of the main body member 20, and the rear end surface 41a of the base end portion 41 of the cover member. Here, the outer peripheral surface 25a and the front end surface 21a correspond to "exposed surface of the attachment portion that is not covered by the cover member".

In the embodiment shown in FIGS. 2 and 3, the annular step portion 26 in the main body member 20 is not necessary. Therefore, for example, as shown in parts (A) and (B) of FIG. 8, the base end portion 41 of the cover member 40 may reach the vicinity of the base portion 21 of the main body member 20, and the seal member 30 may be disposed on the outer peripheral surface of the cover member 40. In these cases, an annular ridge 44 (a structure similar to the base end portion 41 in FIG. 2) that serves as a restraining surface 44a facing the front end surface 21a of the base portion 21 of the main body member 20 may be provided at a tip end position of the cover member 40 (see part (A) of FIG. 8), or may be provided in the middle of the cover member 40 in a longitudinal direction (see part (B) of FIG. 8). According to parts (A) and (B) of FIG. 8, the annular groove-shaped seal member attachment region R1 is defined by the outer peripheral surface of the cover member 40, the front end surface 21a of the base portion 21 of the main body member 20, and the restraining surface 44a of the annular ridge 44 of the cover member 40. Here, the front end surface 21a corresponds to "an exposed surface of the attachment portion that is not covered by the cover member", and the restraining surface 44a of the annular ridge 44 of the cover member 40 corresponds to "one end surface of the cover member".

REFERENCE SIGNS LIST 3 case body (attached body)
10 terminal block (assembled body)
20 main body member
21 base portion
22 first protruding portion (attachment portion of main body member)
23 second protruding portion
24 part near tip end of protruding portion 22
25 part near base end of protruding portion 22
26 annular step portion
30 seal member
35 second seal member
40 cover member
41 base end portion of cover member (one end portion of cover member)
41a rear end surface of base end portion (one end surface of cover member)
45 second cover member
50 bus bar (conductive terminal member)
55 adhesive
R1 seal member attachment region
R2 second seal member attachment region

The invention claimed is:

1. An assembled body attachable to an attached body, the assembled body comprising:
a main body member made of a rigid material and forming a main part of the assembled body;
an annular seal member made of a material that is more easily deformed than the main body member, and assembled on the main body member to close a gap between the main body member and the attached body; and
a cover member assembled on the main body member, wherein the main body member is formed with an attachment portion to be disposed inside the attached body, and the cover member is installed on the attachment portion so as to cover a part of an outer periphery of the attachment portion, and wherein a seal member attachment region extending annularly along the outer periphery of the attachment portion is assigned between a part of the main body member and the cover member installed on the attachment portion of the main body member, and the seal member attachment region is defined at least by an exposed surface of the attachment portion that is not covered by the cover member and one end surface of the cover member.

2. The assembled body according to claim 1, wherein the annular seal member attachment region has a substantially U-shaped cross section.

3. The assembled body according to claim 1, wherein the main body member has a step portion having a surface which faces one end portion of the cover member installed on the attachment portion, and wherein the seal member attachment region is provided between the one end portion of the cover member and the step portion of the main body member.

4. The assembled body according to claim 1, wherein at least a part, on which the cover member is installed, of the attachment portion of the main body member has a tapered shape.

5. The assembled body according to claim 1, further comprising:

a second seal member.

6. The assembled body according to claim 5, further comprising:

a second cover member provided correspondingly to the second seal member, wherein a second seal member attachment region for the second seal member is provided between the cover member and the second cover member.

7. The assembled body according to claim 1, wherein the cover member is fixed to the attachment portion of the main body member by an adhesive.

8. The assembled body which functions as a terminal block according to claim 1, further comprising:

a bus bar functioning as a conductive terminal member, wherein the main body member includes a plate-shaped base portion and a protruding portion protruding from the base portion, wherein a part of the bus bar is embedded in the main body member, and another part of the bus bar protrudes outward from the protruding portion of the main body member and is exposed, and wherein the cover member is provided around the protruding portion of the main body member.

* * * * *